United States Patent [19]

Abe

[11] Patent Number: 4,561,021

[45] Date of Patent: Dec. 24, 1985

[54] FREQUENCY DETERMINING APPARATUS

[75] Inventor: Norio Abe, Nagaokakyo, Japan

[73] Assignee: Mitsubishi Denki Kabushiki Kaisha, Tokyo, Japan

[21] Appl. No.: 478,520

[22] Filed: Mar. 22, 1983

[30] Foreign Application Priority Data

Apr. 5, 1982 [JP] Japan .................................. 57-57681

[51] Int. Cl.$^4$ .............................................. H04N 5/05
[52] U.S. Cl. ..................................... 358/158; 328/63; 328/179; 328/187; 358/153
[58] Field of Search ............... 358/139, 148, 150, 153, 358/158; 328/63, 179, 187; 375/91

[56] References Cited

U.S. PATENT DOCUMENTS

| 2,654,801 | 10/1953 | Atwood | 375/91 |
| 4,253,116 | 2/1981 | Rodgers | 358/158 |
| 4,298,890 | 11/1981 | Lai | 358/158 |

OTHER PUBLICATIONS

*IBM Technical Disclosure Bulletin*, vol. 5, No. 11, Apr. 1963, J. R. Featherston, "Digital Demodulator".

*Primary Examiner*—Howard W. Britton
*Attorney, Agent, or Firm*—Lowe King Price & Becker

[57] ABSTRACT

A frequency determining apparatus discriminates between two different frame frequencies in television signals. A binary counter (4) makes a 1/64 frequency division of a horizontal synchronizing signal outputted from a horizontal synchronizing signal producing circuit (2), and further makes a ½ frequency division of the frequency divided output therefrom. A NAND gate (5) is responsive to the 1/64 frequency divided output and the ½ frequency divided output from the binary counter to detect the normal frame signal at 60 Hz, thereby to set a D-type flip-flop (8). Another NAND gate (51) is responsive to the signal obtained by inverting the 1/64 frequency divided output from the binary counter (4) and the ½ frequency divided signal to detect the normal frame signal at 50 Hz, thereby to set another D-type flip-flop (81). An R-S flip-flop (13) is set by the respective outputs from these D-type flip-flops whereby a desired determined signal is outputted.

3 Claims, 11 Drawing Figures

FIG. 1

PRIOR ART

FIG. 2

PRIOR ART

PRIOR ART

| R INPUT | S INPUT | Q OUTPUT | Q̄ OUTPUT |
|---|---|---|---|
| L | H | H | L |
| H | L | L | L |
| L | L | H | H |
| H | H | $Q_n = Q_{n+1}$ | $\bar{Q}_n = \bar{Q}_{n+1}$ |

FIG. 11

FREQUENCY DETERMINING APPARATUS

BACKGROUND OF THE INVENTION

1. Field of the Invention

The present invention relates to a frequency determining apparatus. To be more specific, the present invention relates to an improvement of such a frequency determining apparatus that may be applicable to a multiple-system television receiver and may discriminate two different frame frequencies.

2. Description of the Prior Art

A multiple-system television receiver comprises such a frame frequency determining apparatus that discriminates between two television signals whose frame frequencies are different, such as 50 Hz and 60 Hz, for example, thereby to turn on a right vertical deflection circuit automatically. Such frame frequency determining circuits, in general, extract the vertical synchronizing pulses from the synchronizing signal, thereby to detect the period. Naturally, the periods of the vertical synchronizing pulses of 50 Hz and 60 Hz are 20 m sec and 16.7 m sec, respectively. In such cases where the synchronizing signal is disturbed by noises that have mixed in it when a television receiver is receiving a broadcast signal in the weak field intensity, or it is disturbed by reinsertion of a synchronizing signal when a video tape recorder is being played back in a special mode (such as speed search, stop mode), or the like, it becomes difficult to discriminate between the frame frequencies with the periods of 20 m sec and 16.7 m sec.

Figure 1:
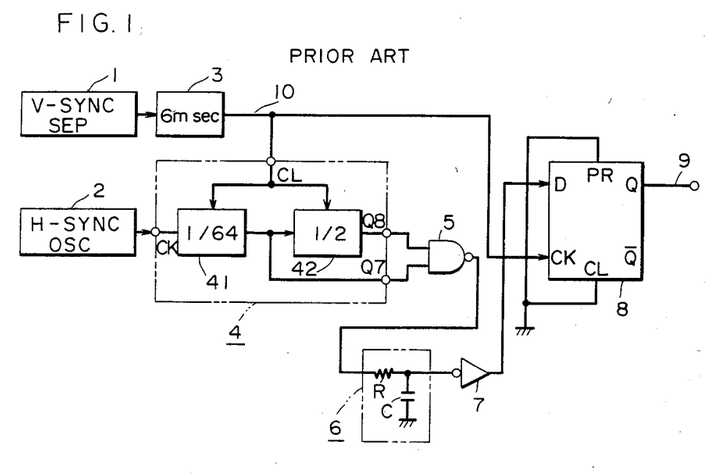
FIG. 1 is a block diagram showing an example of a conventional frequency determining circuits.

FIG. 1 is a block diagram showing an example of conventional frame frequency determining circuits. Referring to the drawing, vertical synchronizing pulses from the vertical synchronizing pulse separator circuit 1 are applied to a monostable multivibrator 3. Horizontal synchronizing pulses from a horizontal oscillator circuit 2 are given to a binary counter 4. The monostable multivibrator 3 is adapted so that it converts the received vertical synchronizing pulses into the pulses delayed by 6 m sec. The output 10 (the signal to be determined) from the monostable multivibrator 3 is given to the binary counter 4. The binary counter 4 includes a 1/64 frequency divider 41 and a ½ frequency divider 42. The signal to be determined 10 is provided for each of the 1/64 frequency divider and the ½ frequency divider as a clear signal. In the mean time, the horizontal synchronizing pulses that are inputted to the binary counter 4 are given to the 1/64 frequency divider 41 and undergo the frequency determination thereby. The output from the 1/64 frequency divider 41 is given to the ½ frequency divider and is also given to one input of a NAND gate 5 as the ouput Q7. The output from the ½ frequency divider 42 is given to the other input of the NAND gate 5 as the output Q8. The output from the NAND gate 5 is given through an integrator circuit 6 and an inverter 7 to a data input (D) of a D-type flip-flop 8. The signal to be determined 10 from the monostable multivibrator 3 is given to a clock input (CK) of the D-type flip-flop 8, wherein, since both the preset terminal (PR) and the clear terminal (CL) are grounded, the D-type flip-flop 8 functions so that, when its input D is at the high level, its output Q will reach the high level at the rise of the input CK. This output Q is taken out as the determined signal 9.

Figure 2:
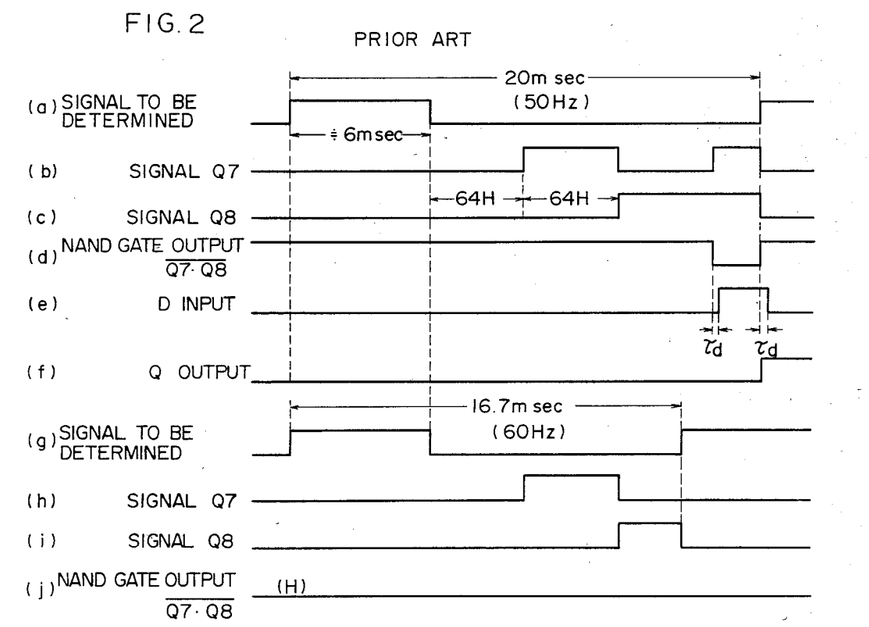
FIG. 2 is a time chart explaining the operation of the frequency determining circuit in FIG. 1 in the normal state.

FIG. 2 is a time chart explaining the operation of the circuit shown in FIG. 1 in determining the frequency of the vertical synchronizing pulses when it is free from noise. With reference to FIG. 2, a description will be made in the following of the normal operation taking place in the case where the vertical synchronizing pulses are free from noise. In the case where the frequency of the vertical synchronizing pulses shown in FIG. 2 (a) is 50 Hz, the period of the signal to be determined 10 is 20 m sec. The 1/64 frequency divider 41 and the ½ frequency divider 42 are enabled from the point of the fall of the signal to be determined 10. The frequency of the output Q7 from the 1/64 frequency divider 41 shown in FIG. 2 (b) will become a 1/64 frequency division of the frequency of the horizontal synchronizing pulses, 15.625 kHz. Hence, the output Q7 from the 1/64 frequency divider becomes such pulses of 244 Hz that will rise after 4.096 m sec (64 H) and will fall after further 4.096 m sec. The output Q8 from the ½ frequency divider 42 shown in FIG. 2 (c) will, similarly due to the frequency division of $1/64 \times \frac{1}{2} = 1/128$, rise 8.19 m sec, and fall 16.38 m sec, after the point of the fall of the signal to be determined 10. Practically, however, since the clearing input of the signal to be determined 10 enters before that, the output Q8 from the ½ frequency divider falls simultaneously with the rise of the signal to be determined 10. The output of the NAND gate becomes low when both the outputs Q7 and Q8 are of the high level (FIG. 2 (d)). This output from the NAND gate 5 is, after being delayed by a time τd by means of the integrator circuit 6, inverted by the inverter 7. As described above, the D-type flip-flop 8 functions so that, when its input D is of the high level, its output Q becomes the high level at the rise of the input CK. As shown in FIG. 2 (e) and (f), in the case where the frame frequency is 50 Hz, the signal to be determined 10, namely the input CK of the D-type flip-flop 8, rises while the input D of the flip-flop 8 is at the high level and, therefore, the output Q of the flip-flop 8 is always at the high level. Hence the determined signal 9 is always the high level.

In the following a description will be made of the case where the frame frequency is 60 Hz, namely the period of the signal to be determined 10 is 16.7 m sec (FIG. 2 (g)). While the signal Q7 will, as shown in FIG. 2 (h), behave similarly to the above case, the signal Q8 will, as shown in FIG. 2 (i), fall to the low level, at the rise of the signal to be determined 10, before the Q7 rises to the next high level, and thus the output of the NAND gate 5, or $\overline{Q7 \cdot Q8}$, is always held at the high level. Accordingly, in this case, the input D (not shown in the drawing) of the D-type flip-flop 8 always becomes the low level. In the D-type flip-flop 8 whose input D is thus held at the low level, its output Q becomes the low level at the rise of the input CK and the output Q thereafter keeps on this state.

As described thus far, the determined output 9 becomes the high level when the frame frequency is 50 Hz and becomes the low level when the same is 60 Hz and thus the circuit shown in FIG. 1 is understood to have the desired determining function.

However, the circuit shown in FIG. 1 is apt to malfunction when receiving the signal at 50 Hz, whereas it is unlikely to do so when receiving the signal at 60 Hz. This will be explained below.

Figure 3:
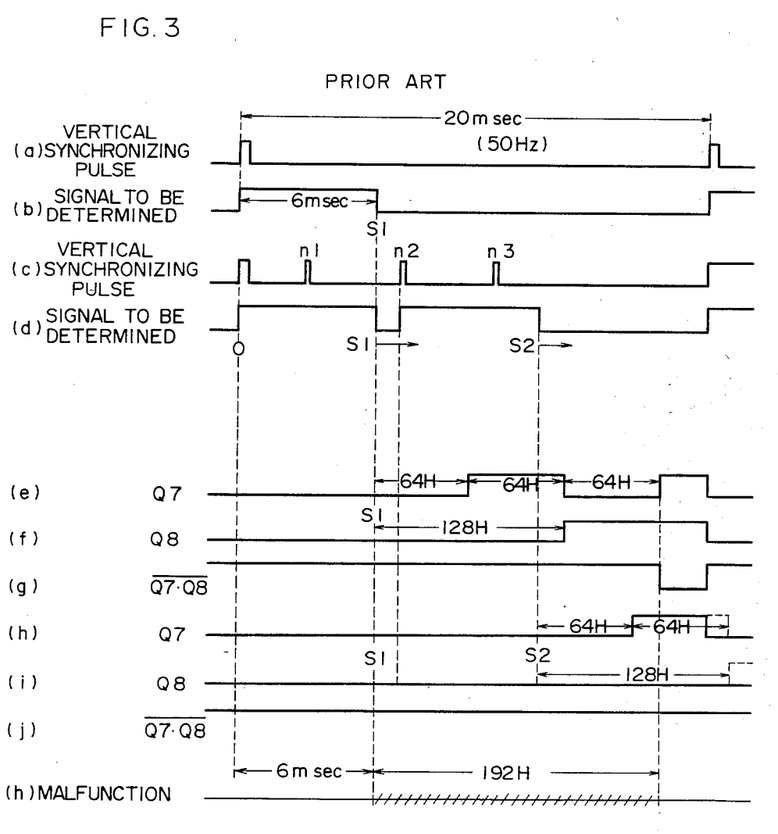
FIGS. 3 and 4 are time charts explaining the operation of the circuit in FIG. 1 when noise pulses mix in the vertical pulses.

FIG. 3 is a time chart for explaining a probable malfunction of the circuit shown in FIG. 1 when receiving the signal at 50 Hz. On the occasion when vertical synchronizing pulses free from mixed-in noises are outputted from the vertical synchronizing pulse separator circuit 1, the output from the monostable multivibrator 3, namely the signal to be determined 10, will, as shown in FIG. 3 (b) be such pulses each of which may fall 6 m sec after its rise as described above. Now assume a case where the vertical synchronizing pulses with mixed-in noises n1, n2, and n3 as shown in FIG. 3 (c) are outputted from the vertical synchronizing pulse separator circuit 1. At that time, the monostable multivibrator 3 is not affected at all by the noise n1 which falls within the delay time 0 - S1 (FIG. 3 (d)) of the monostable multivibrator 3, but it is affected by the noise n2 which is mixed in after the end of the delay time S1 and produces a pulse lasting from 6 m sec from the point of the rise of the noise n2. Since the binary counter 4 is enabled after the delay time has passed, namely from the point S1, if there is no noise mixed in, the signals Q7, Q8, and Q7.Q8 (the logical product of Q7 and Q8) behave properly as shown in FIG. 3 (e), (f), and (g), respectively, but if there is such a noise as the noise n2, the binary counter 4 starts to operate again from the point S2, and thus the signals Q7, Q8, and Q7.Q8 behave as shown in FIG. 3 (h), (i), and (j), and hence the input D of the D-type flip-flop does not appear. Therefore, the range of time of the occurrence of a malfunction in the construction as shown in FIG. 1 when receiving the signal at 50 Hz is 192H from the point 6 m sec after the rise of the normal vertical pulse as indicated in FIG. 3 (k). To be more specific, a malfunction will occur if a noise gets mixed in within the range of time.

Figure 4:
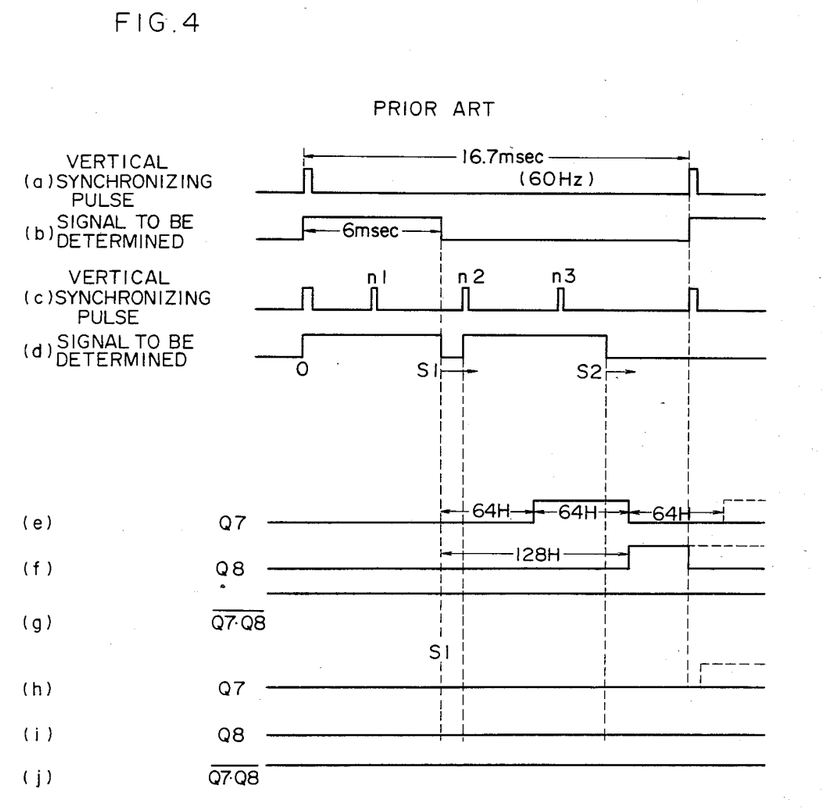

FIG. 4 is a time chart showing the operation of the circuit as shown in FIG. 1 when determining the vertical synchronizing signal at 60 Hz. As explained in the foregoing with reference to FIGS. 1 and 2, since the signal Q8 becomes the low level at the rise of the signal to be determined 10 before the signal Q7 becomes the high level, even if there are such noises mixed in as n1, n2, and n3 that are mentioned in the above explanation with reference to FIG. 3, a malfunction will not occur. To be more specific, even if the noise n2 gets mixed in after the end (S1) of the delay time causing the binary counter 4 to operate again, there is no possibility for both the singals Q7 and Q8 to become the high level simultaneously and, therefore, $\overline{Q7.Q8}$ is kept on at the high level and the signal at the low level is outputted from the D-type flip-flop 8.

Figure 5:
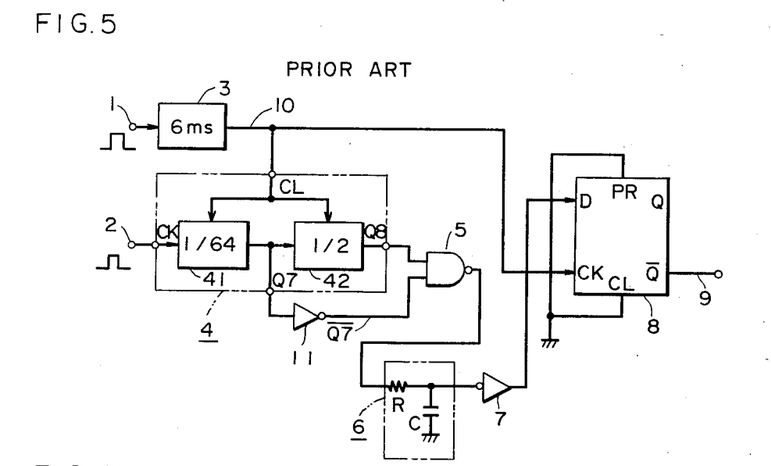
FIG. 5 is a block diagram showing another example of the conventional frequency determining circuit.

FIG. 5 is a block diagram showing another example of conventional frame frequency determining circuits. In the circuit in FIG. 5, the output Q7 from the 1/64 frequency divider 41 is applied to the NAND gate 5 through the inverter 11. Hence the NAND gate 5 will output the signal $\overline{Q7.Q8}$ and the output $\overline{Q}$ is taken out from the D-type flip-flop 8 as the determined output 9.

Figure 6:
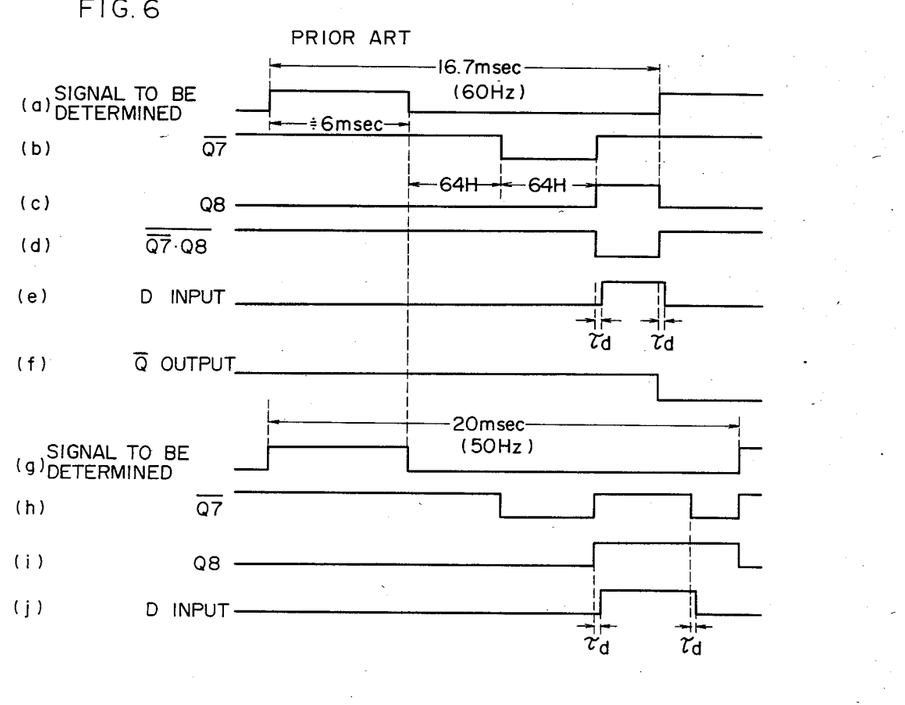
FIG. 6 is a time chart explaining the operation of the frequency determining circuit in FIG. 5 in the normal state.

FIG. 6 is a flow chart explaining a normal operation of the circuit in FIG. 5. A description of a normal operation in the circuit in FIG. 5 will be given below with reference to FIG. 6.

First considering a case where the signal to be determined 10 is 60 Hz, the similar operation to the case previously described with reference to FIG. 2 will take place, but when the input D of the D-type flip-flop 8 is the high level, namely when the signal obtained by means of the delaying by a time τd and the inversion by the inverter 7 of the signal $\overline{Q7.Q8}$ is the high level as indicated in FIG. 6 (e), the rise of the input CK at that time will cause the output Q to become the high level as shown in FIG. 6 (f), hence the output $\overline{Q}$ becomes the low level. Thus, this output $\overline{Q}$, namely the determined signal 9, is held at the low level.

Then, considering a case with 50 Hz, as indicated in FIG. 6 (j), when the input D is the low level, the input CK will rise, and therefore the output Q will become the low level and the output $\overline{Q}$ will become the high level (not shown in the drawing).

As explained thus far, the circuit in FIG. 5 provides quite the same results to the determined output 9 as does the circuit in FIG. 1. As will be explained below, however, the circuit in FIG. 5, contrary to the circuit in FIG. 1, is apt to malfunction when receiving the signal at 60 Hz, but is unlikely to make such a malfunction when receiving the signal at 50 Hz.

Figure 7:
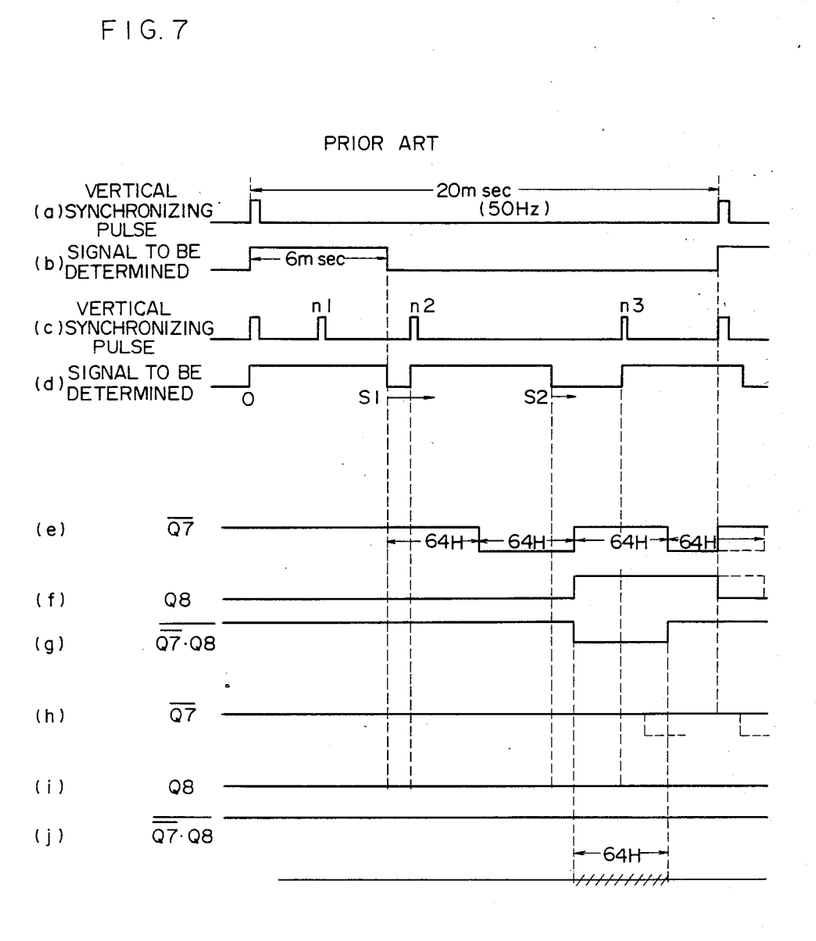
FIGS. 7 and 8 are time charts explaining the operation of the circuit in FIG. 5 when noise pulses mix in the vertical pulses.
Figure 8:
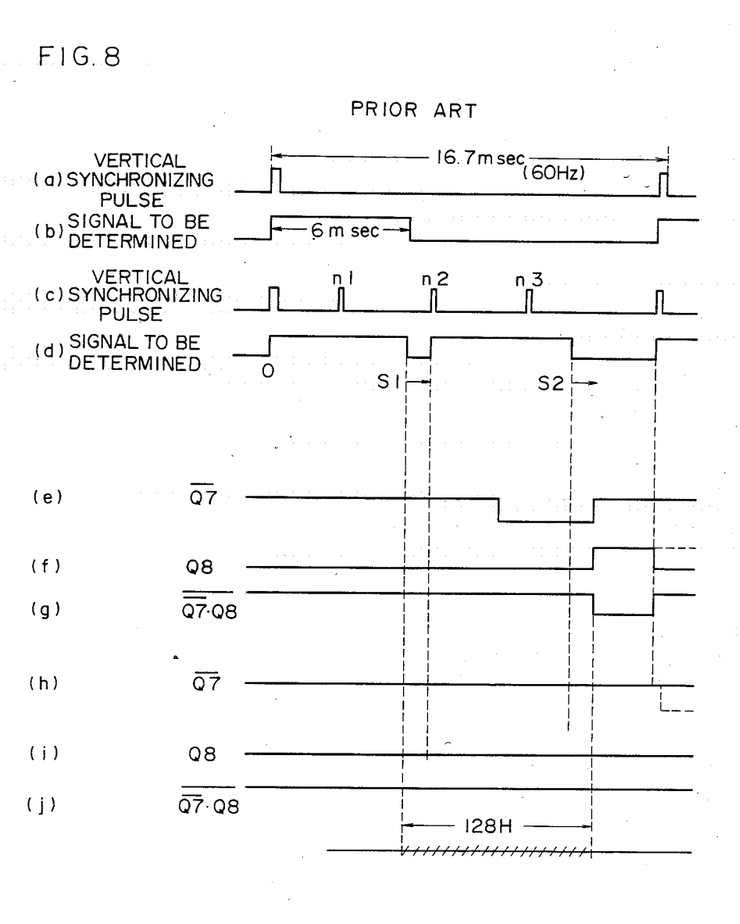

FIG. 7 is a time chart explaining the occurrence of a malfunction in the circuit in FIG. 5 when receiving the signal of 50 Hz. FIG. 8 is a time chart explaining the occurrence of a malfunction when receiving the signal at 60 Hz.

Referring to FIG. 7, the state of the circuit in which a malfunction occurs when it is receiving the signal of 50 Hz is similar to that described above with reference to FIG. 3 and, although a detailed explanation is omitted here, it would be appreciated that a malfunction occurs if noise gets mixed in during the period of time when the signal $\overline{Q7.Q8}$ is the high level in the course of the normal operation, because this period of time corresponds to the time for a normal pulse to arise for the signal at 50 Hz.

As to the malfunction in the circuit in FIG. 5 when receiving the signal at 60 Hz, the range of time for the occurrence of the malfunction it is the period of 128H as indicated in FIG. 8.

As explained thus far, it would be appreciated that the frequency determining circuit in FIG. 5, contrary to the frequency determining circuit in FIG. 1, is apt to malfunction when receiving the signal at 60 Hz and less liable to cause such a malfunction for the signal of 50 Hz. Therefore either the frequency determining circuit mentioned with reference to FIG. 1 or that with reference to FIG. 5 has both merits and demerits, and thus the accurate frequency determination has not been possible so far.

SUMMARY OF THE INVENTION

Accordingly, a primary object of the present invention is to provide a frequency determining apparatus which, in discriminating between two different frequencies, has less possibility of malfunction with either of the frequencies dealt.

The present invention comprises a first frequency determining means for determining a first frequency, a second frequency determining means for determining a second frequency, and a two-state storing means whose states of storage may be complementarily changeable dependent on the output of the first frequency determining means and the output of the second frequency determining means, wherein the first frequency determining means is preferentially picked out when determining the first frequency and the second frequency determining means is preferentially picked out when determining the second frequency.

Hence, according to the present invention, by extracting the output of the first frequency determining means when determining the first frequency if and when the second frequency determining means is malfunctioning, or in reverse, by extracting the output of the second frequency determining means when determining the second frequency if and when the first frequency determining means is malfunctioning, the present invention when applied to discrimination between the first and the second frequencies can provide the desired frequency determined signal output free from any undesired output due to such a malfunction.

In a preferred embodiment of the present invention, the first and the second frequency divider means are reset by the vertical synchronizing signal from the vertical synchronizing signal output means, then the horizontal synchronizing signal from the horizontal synchronizing signal output means is applied to the first frequency divider means to be frequency divided by the first frequency division ratio, and the divided output is further frequency divided by the second frequency divider means by its frequency division ratio. Both the outputs from the first and the second frequency divider means are gated by the first gate means, and the output thereof is, depending on the vertical synchronizing signal, retained by the first state storing means. Further, the inverted signal of the first frequency divider means output and the second frequency divider means output are gated by the second gate means, and the output thereof is, depending on the vertical synchronizing signal, retained by the second state storing means. Responsive to the outputs of the first and the second state storing means, the two-state storing means changes its state complementarily.

Thus, according to this embodiment, the two-state storing means can provide the normal frequency determined signal output, which is free from an undesired signal due to the frequency determination made by a malfunction.

These objects and other objects, features, aspects and advantages of the present invention will become more apparent from the following detailed description of the present invention when taken in conjunction with the accompanying drawings.

DESCRIPTION OF THE PREFERRED EMBODIMENT

Figure 9:
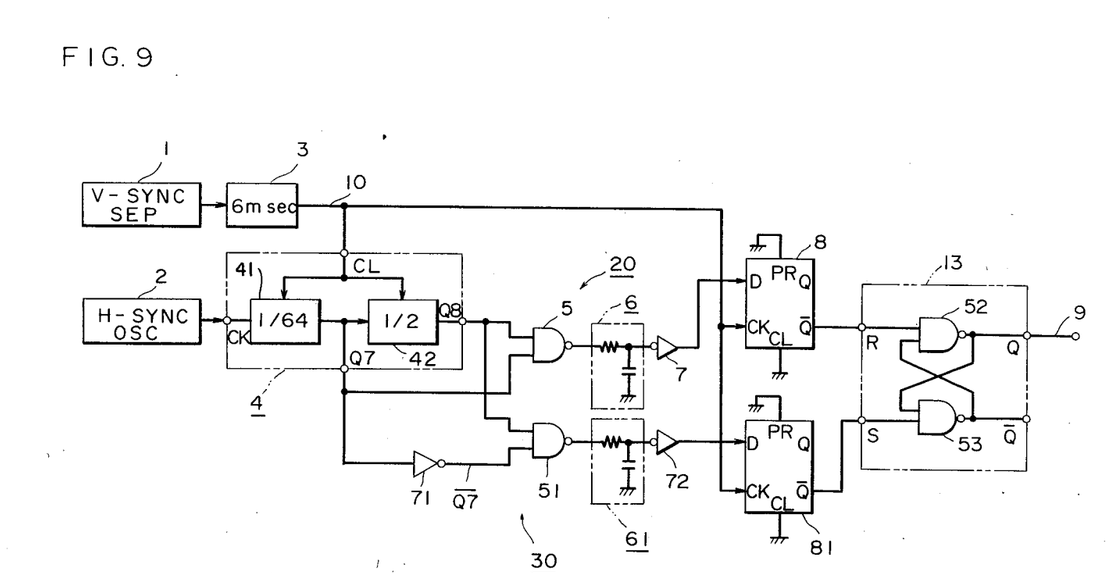
FIG. 9 is a block diagram showing an embodiment of the present invention.

FIG. 9 is a block diagram showing one embodiment of the present invention. This embodiment in its construction is similar to the circuit as shown either in FIG. 1 or in FIG. 5 except that it includes an additional R-S flip-flop as described below; the corresponding components being denoted by identical reference characters, explanation thereof is omitted here. To explain in a broad way, the embodiment includes a combination of the circuit in FIG. 1 and that in FIG. 5, and in addition thereto an R-S flip-flop 13, wherein it is so arranged that the determining output in conformity with that in the circuit in FIG. 5 is preferentially extracted at the reception of the signal at 50 Hz, or the determining output in conformity with that in the circuit in FIG. 1 is preferentially extracted at the reception of the signal at 60 Hz.

The NAND gate 51 is provided corresponding to the NAND gate 5. To this NAND gate 51 are given both the output Q7 of the 1/64 frequency divider 41 through the inverter 71 and the output Q8 of the $\frac{1}{2}$ frequency divider 42. The output of the NAND gate 51 is applied through the integrator circuit 61 and the inverter 72 to the input D of the D-type flip-flop 81. The signal to be determined 10 from the monostable multivibrator 3 is applied to the input CK of the D-type flip-flop 81. The output $\overline{Q}$ of the D-type flip-flop 8 is applied to the input R of the R-S flip-flop 13. Also the output $\overline{Q}$ of the D-type flip-flop 81 is applied to the input S of the R-S flip-flop 13. The output Q of the R-S flip-flop 13 is extracted as the determined signal 9.

Figure 10:
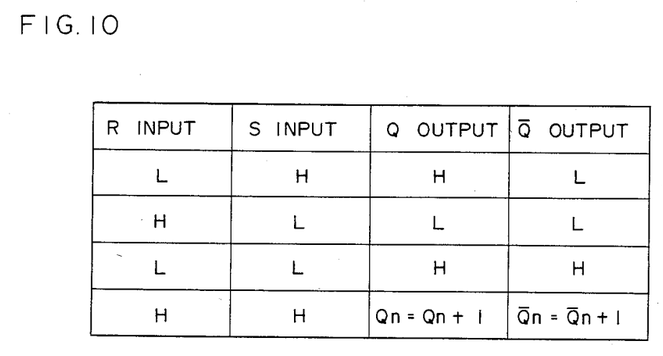
FIG. 10 is a truth table showing variations in the state in the R-S flip-flop.

FIG. 10 is a truth table indicating changes in the states of the R-S flip-flop 13. As apparent from this table, the R-S flip-flop 13 maintains the previous state when both the inputs R and S are the high level.

Figure 11:
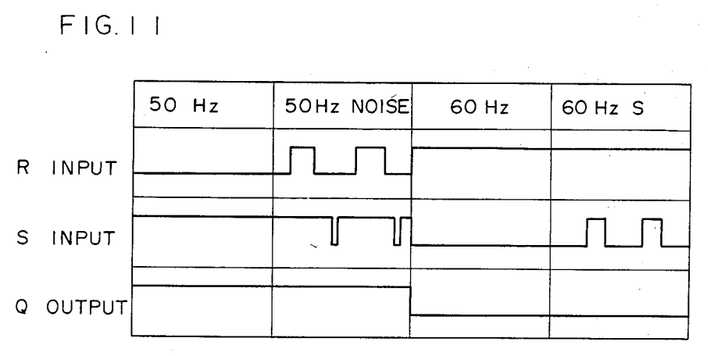
FIG. 11 is a diagram showing operational states in the frequency determining circuits in FIG. 9 when noise pulses mix in the vertical pulses while the circuit is receiving the signals both at 50 Hz and at 60 Hz.

FIG. 11 is a diagram showing the states of malfunction occurring on the occasions when noise pulses have mixed in the signals at the reception of the signals at 50 Hz and at 60 Hz, wherein the D-type flip-flop 8 as shown in FIG. 9 provides the determining outputs corresponding to that in the circuit in FIG. 1 for the input R of the R-S flip-flop, and the D-type flip-flop 81 provides the determining output corresponding to that in FIG. 5 for the input S of the R-S flip-flop 13. However, since the output $\overline{Q}$ is being extracted from the D-type flip-flop 8, which is different from that in the circuit in FIG. 1, the polarity for signals at 50 Hz and at 60 Hz are opposite to that in the output $\overline{Q}$ in the D-type flip-flop 81.

The operation of the embodiment as shown in FIG. 9 will be described below, but since the operations of the circuits before the R-S flip-flop 13 can easily be understood from the earlier description of the operations in the circuits shown in FIG. 1 and FIG. 5, such explanation will be omitted here; the explanation of the operation of the R-S flip-flop 13 will be explained referring chiefly to FIG. 11. Referring to FIG. 11, the output Q of the D-type flip-flop 8 reaches the high level due to occasional malfunction in the circuit, as in the circuit shown in FIG. 1, when receiving the signal at 50 Hz. On the other hand, the output $\overline{Q}$ of the D-type flip-flop 81 reaches the high level due to occasional malfunction in the circuit, as in the circuit in FIG. 5, when receiving the signal at 60 Hz. Even if such malfunctions occur, the output $\overline{Q}$ of the R-S flip-flop 13 does not suffer any change. The accurately determined signal 9 therefore can be obtained from the R-S flip-flop 13.

Incidentally, on the occasion when noise mixs in the signal when the circuit is receiving the signal at 50 Hz, the D-type flip-flop 81 may cause a wrong state on its output as indicated in FIG. 7, but even so, the final wrong output may not appear in the determined output 9 unless the malfunction coincides with that of the D- type flip-flop 8 as indicated in FIG. 11. Therefore, an insertion of an appropriate time constant circuit between the output Q of the D-type flip-flop 81 and the input S of the R-S flip-flop 13 is useful to lessen the malfunction. Further, it is also useful against the malfunction to insert a time constant circuit as mentioned above between the determined output 9 and the switching circuit for the vertical deflection circuit (not shown in the drawing).

While the explanation has so far been given chiefly in connection with the discrimination between the two different frame frequencies, the present invention can also be applied to the discrimination of other different two frequencies than those frame frequencies.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. Apparatus for discriminating between two frame frequencies in television signals including:
   means for detecing a first frame frequency and providing a signal indicative of presence or absence of said first frame frequency, said means for detecting said first frame frequency further including means providing an accurate indication of presence of said first frame frequency and susceptible to error in indicating absence of said first frame frequency,
   means for detecting a second frame frequency and providing a signal indicative of presence or absence of said second frame frequcney, said means for detecting said second frame frequency further including means providing an accurate indication of presence of said second frame frequency and susceptible to error in indicating absence of said second frame frequency, and
   two-state means for combining outputs from said means for detecting said first and second frequencies and operable for providing an output responsive to said first means when said first frequency is present and responsive to said second means when said second frequency is present.

2. A frequency determining apparatus for discriminating between first and second different frequencies, comprising:
   first frequency determining means (20) for determining said first frequency,
   second frequcney determining means (3) for determining said second frequency, and
   two state storing means (13) for storing two stored states which are complementarily changeable responsive to outputs of said first frequency determining means and said second frequency determining means,
   wherein both said first and second frequencies being frame frequencies involved in television signals including horizontal synchronizing signals and vertical synchronizing signals, and further comprising
   vertical synchronizing signal providing means (1) for providing said vertical synchronizing signal included in said television signals,
   horizontal synchronizing signal providing means (2) for providing said horizontal synchronizing signal included in said television signals,
   first frequency divider means (41) dividing the frequency of said horizontal synchronizing signal from said horizontal synchronizing signal from said horizontal synchronizing signal providing means by a first frequency division ratio, and
   second frequency divider means (42) for dividing the frequency of an output from said first frequency divider means by a second frequency division ratio,
   said first frequency determining means comprising first determining means (5, 8) for determining said first frequency responsive to predetermined frequency divided outputs of said first and second frequency divider means,
   said second frequency determining means comprising second determining means (51, 81) for determining said second frequency responsive to further predetermined frequency divided outputs, different from said predetermined frequency divided outputs, of said first and second frequency divider means.

3. A frequency determining apparatus in accordance with claim 2, wherein
   said first determining means comprises
      first gate means (5) for gating the output of said first frequency dividier means and the output of said second frequency divider means, and
      first state storing means (8) for retaining an output from said first gate means responsive to said vertical synchronizing signal from said vertical synchronizing signal providing means, and
   said second determining means comprises
      second gate means (51) for gating an inverted signal of the output of said first frequency divider means and the output of said second frequency divider means and
      second state storing means (81) for retaining an output from said second gate means responsive to said vertical synchronizing signal from said vertical synchronizing signal providing means.

* * * * *